(12) United States Patent
Shiota et al.

(10) Patent No.: US 7,060,394 B2
(45) Date of Patent: Jun. 13, 2006

(54) HALFTONE PHASE-SHIFT MASK BLANK AND HALFTONE PHASE-SHIFT MASK

(75) Inventors: Yuki Shiota, Tokyo (JP); Osamu Nozawa, Tokyo (JP); Hideaki Mitsui, Tokyo (JP)

(73) Assignee: Hoya Corporation, Tokyo (JP)

( * ) Notice: Subject to any disclaimer, the term of this patent is extended or adjusted under 35 U.S.C. 154(b) by 411 days.

(21) Appl. No.: 10/107,825

(22) Filed: Mar. 28, 2002

(65) Prior Publication Data

US 2003/0064297 A1    Apr. 3, 2003

(30) Foreign Application Priority Data

Mar. 30, 2001 (JP) .......................... P. 2001-099999
Mar. 30, 2001 (JP) .......................... P. 2001-101529
Mar. 30, 2001 (JP) .......................... P. 2001-101754

(51) Int. Cl.
   *G01F 9/00*     (2006.01)

(52) U.S. Cl. ........................................... 430/5

(58) Field of Classification Search ................. 430/5, 430/30, 324, 323
   See application file for complete search history.

(56) References Cited

U.S. PATENT DOCUMENTS 5,897,977 A    4/1999    Carcia et al.
5,939,227 A    8/1999    Smith

FOREIGN PATENT DOCUMENTS

| JP | 7-199447 | 8/1995 |
| JP | 8-211591 | 8/1996 |
| JP | 2000-511301 | 8/2000 |

*Primary Examiner*—S. Rosasco
(74) *Attorney, Agent, or Firm*—Sughrue Mion, PLLC

(57) ABSTRACT

A halftone phase-shift mask blank, in which the phase shifter film is composed of two layers, a low-transmission layer having a principal function of transmittance control, and a high-transmission layer having a principal function of phase shift control, the extinction coefficient $K_1$ of the low-transmission layer and the extinction coefficient $K_2$ of the high-transmission layer satisfy $K_2 < K_1 \leq 3.0$ at an exposure wavelength $\lambda$ falling between 140 nm and 200 nm, and the thickness $d_1$ of the low-transmission layer satisfies $0.001 \leq K_1 d_1/\lambda \leq 0.500$ at the exposure wavelength $\lambda$.

25 Claims, No Drawings

HALFTONE PHASE-SHIFT MASK BLANK AND HALFTONE PHASE-SHIFT MASK

BACKGROUND OF THE INVENTION

1. Field of the Invention

The present invention relates to a phase-shift mask which, taking advantage of the interference action of its phase shifter, improves the resolution of transfer patterns, and to a phase-shift mask blank for it. In particular, the invention relates to a halftone phase-shift mask and to a blank for it.

2. Description of the Related Art

A phase-shift process is one ultra-resolution technique in photolithography, and, when compared with a process of using an ordinary photomask in the same exposure wavelength range, it increases the contrast of transferred images and enables fine pattern transfer over wavelength limits. In the phase-shift process, a phase-shift mask is used for transferring fine patterns.

A halftone phase-shift mask is a type of phase-shift mask. It is said that the transmittance of the phase shifter part (semi-transmissive part) of the halftone phase-shift mask is from about a few % to tens % of that of the non-pattern part (light-transmissive part) thereof and halftone phase-shift masks are effective in forming contact holes and insulation patterns. Halftone phase-shift masks have become widely used mainly for forming contact holes, as they are relatively easy to fabricate through patterning. The halftone phase-shift mask comprises a light-transmissive part, and a semi-transmissive halftone phase shifter part having a function of shifting the phase of light. The phase of light having passed through the two parts of the mask is shifted generally to 180° to cause mutual interference at the pattern boundaries, and the contrast of the transferred images is thereby increased. As a result, the focal depth to attain the necessary resolution of the mask is enlarged, and it is therefore possible to increase the resolution of the mask and to broaden the process latitude thereof without changing the exposure light wavelength. From the layer constitution of the halftone phase shifter part thereof, the halftone phase-shift mask is grouped into two types, a single-layered mask and a multi-layered mask.

For the single-layered phase-shift mask, for example, known are $SiO_x$-based or $SiO_xN_y$-based masks such as those described in Japan Patent Laid Open Hei 7-199447, and $SIN_x$-based masks such as those described in Japan Patent Laid Open Hei 8-211591. Some examples of the multi-layered phase-shift mask are described in U.S. Pat. No. 5,939,227 and Japan Patent Unexamined Publication 2000-511301.

The advantage of the single-layered halftone phase-shift mask is that its structure is simple and its production is relatively easy. Therefore, most halftone phase-shift masks now produced on a large scale are single-layered ones. On the other hand, the advantage of the multi-layered halftone phase-shift mask is that different parameters of transmittance and phase shift degree that must be controlled in masks can be controlled independently therein.

In most multi-layered masks, the halftone phase shifter part comprises a combination of a light-shielding layer and a transparent layer. The light-shielding layer is made of a material capable of shielding the light that falls within an exposure wavelength range; and the transparent layer is made of a transparent material of which the transmittance within an exposure wavelength range is at least 80%. In such a multi-layered halftone phase-shift mask, the light-shielding layer acts to control the transmittance of the mask to a practical degree, and the transparent layer thereof acts to ensure the necessary phase shift to 180° relative to the pattern aperture (light-transmissive part). To that effect, the two layers in the multi-layered halftone phase-shift mask have different roles and functions independent of each other.

To meet the prospective requirement for finer circuit patterns, it is now inevitable to further shorten the wavelength of light for exposure even though the best use of the phase-shift ultra-resolution technique is made. At present, an ArF excimer laser of 193 nm and an $F_2$ excimer laser of 157 nm are being investigated for the exposure light source in photolithography in the coming generation. However, there are known only a few transparent materials having a transmittance of at least 80% in such a exposure wavelength range, for example, $CaF_2$ and high-purity quartz. Most materials absorb at least about 20% of light and reflect at least about 10% of light in that range. In other words, the materials except $CaF_2$ and high-purity quartz, which are for the transparent layer in the current photomasks to be exposed to ordinary light longer than the short-wave light as above, could not form a transparent layer but form a high-transmission having a transmittance of smaller than 70% in the coming photomasks to be exposed to the short-wave light as above. Therefore, in case where the current multi-layered halftone phase-shift masks having the constitution as above are exposed to the short-wave light as above, the transparent layer therein will inevitably act to control and lower its transmittance, and, as a result, its transmittance will be lower than the necessary level for halftone phase-shift masks.

One method for solving the problem is to reduce the thickness of the high-transmission layer in the photomasks to be exposed to short-wave light—the layer corresponds to the transparent layer in the current photomasks to be exposed to ordinary, not shortened light. In this case, however, the phase shift to be attained by the high-transmission layer is not good.

When a conventional single-layered halftone phase-shift mask is exposed to such short-wave light, it is difficult to control both the transmittance and the film thickness of the mask to such a degree that the mask exposed to the light could produce the desired phase shift. For example, amount of the phase shift φ (rad) of light having passed through the phase shifter part of a single-layered halftone phase-shift mask is represented by the following formula (1):

$$\phi = 2\pi d(n-1)/\lambda$$

in which n indicates the refractive index of the single-layered film to form the phase shifter part of the mask, d indicates the film thickness, and λ indicates the wavelength of the transmitted light.

Therefore, if the film thickness of the phase shifter part of the mask is reduced in order to prevent the transmittance of the mask from being reduced, the mask could not produce a satisfactory phase shift.

On the other hand, in a multi-layered phase-shift mask but not a single-layered one, the phase shift control and the transmittance control may be effected independently in the different constituent films, and therefore, the multi-layered phase-shift mask could have ideal transmission characteristics. However, the conventional film constitution as in the above-mentioned patent specifications could hardly realize the intended transmission characteristics effective in the wavelength range of $F_2$ excimer laser.

For example, the film constitution of four layers of $Si_3N_4$ and TaN alternately laminated in that order, disclosed in U.S.

Pat. No. 5,939,227; and the film constitution of $AlN/MoN_x$, AlN/TiN, or $RuO_2/HfO_2$ alternately multi-laminated in that order, disclosed in International Patent Publication 511301/2000 could not have optical characteristics (transmittance, phase shift angle) effective in the wavelength range of $F_2$ excimer laser.

Another problem with the multi-layered film constitution is that the reflectance control of the film, which is necessary for mask inspection and for increasing the accuracy in the actual exposure process, is not easy.

In addition, in the process of producing the multi-layered film constitution, the etchability of each layer must be taken into consideration. For this, an important matter is that the multi-layered film constitution facilitates as much as possible the etching process. In particular, it is important that the multi-layered film is so planned that the substrate is not etched in the dry-etching process and the intended phase difference is accurately controlled.

SUMMARY OF THE INVENTION

The present invention has been made in that situation, and its object is to provide a multi-layered halftone phase-shift mask which, when exposed to light in a wavelength range of from 140 to 200 nm including the wavelength 157 nm of $F_2$ excimer laser, is free from the above-mentioned problem of transmittance reduction with the high-transmission layer therein, and to provide a halftone phase-shift mask blank for the mask.

The present invention has been made in the situation as above, and its object is to provide a multi-layered halftone phase-shift mask which has a suitable transmittance that allows its exposure even to light in a vacuum UV range of from 140 to 200 nm, especially to $F_2$ excimer laser of around 157 nm, and has a reduced reflectance in a broad wavelength range including the light for exposure and the light for mask inspection, and which can be easily dry-etched for phase difference control; and to provide a halftone phase-shift mask blank for the mask.

In particular, the invention provides a halftone phase-shift mask of which the reflectance to the exposure light is reduced so as to increase the accuracy in its actual exposure, and provides a halftone phase-shift mask blank for it.

The aspects of the invention is described hereinunder.

(First Aspect of the Invention)

A halftone phase-shift mask blank for halftone phase-shift masks having, on a transparent substrate, a light-transmissive part that transmits light for exposure, and a phase shifter part that transmits a part of the exposure light and shifts the phase of the transmitted light to a predetermined degree; the mask blank having a phase shifter film to form the phase shifter part on the transparent substrate being characterized in that, the phase shifter film is composed of two layers, a low-transmission layer having a principal function of transmittance control, and a high-transmission layer having a principal function of phase shift control, the extinction coefficient $K_1$ of the low-transmission layer and the extinction coefficient $K_2$ of the high-transmission layer satisfy $K_2<K_1\leq 3.0$ at an exposure light wavelength $\lambda$ falling between 140 nm and 200 nm, and the thickness $d_1$ of the low-transmission layer satisfies $0.001\leq K_1 d_1/\lambda \leq 0.500$ at the exposure light wavelength $\lambda$.

(Second Aspect of the Invention)

The halftone phase-shift mask blank of the first aspect of the invention, which satisfies $0.010\leq K_1 d_1/\lambda \leq 0.500$ at $\lambda$ of ArF excimer laser of around 193 nm.

(Third Aspect of the Invention)

The halftone phase-shift mask blank of the first aspect of the invention, which satisfies $0.001\leq K_1 d_1/\lambda \leq 0.250$ at $\lambda$ of $F_2$ excimer laser of around 157 nm.

(Fourth Aspect of the Invention)

The halftone phase-shift mask blank of the first aspect of the invention, wherein the high-transmission layer having a refractive index of $n_2$ and an extinction coefficient of $K_2$ satisfies $n_2\geq 1.5$ and $K_2\leq 0.45$ at the exposure light wavelength $\lambda$ falling between 140 nm and 200 nm.

(Fifth Aspect of the Invention)

The halftone phase-shift mask blank of the fourth aspect of the invention, which satisfies $n_2\geq 1.7$ and $K_2\leq 0.45$ at $\lambda$ of ArF excimer laser of around 193 nm.

(Sixth Aspect of the Invention)

The halftone phase-shift mask blank of the fourth aspect of the invention, which satisfies $n_2\geq 1.5$ and $K_2\leq 0.40$ at $\lambda$ of $F_2$ excimer laser of around 157 nm.

(Seventh Aspect of the Invention)

A halftone phase-shift mask blank for halftone phase-shift masks having, on a transparent substrate, a light-transmissive part that transmits the exposure light, and a phase shifter part that transmits a part of the exposure light and shifts the phase of the transmitted light to a predetermined degree; the mask blank having a phase shifter film to form the phase shifter part on the transparent substrate being characterized in that, the phase shifter film is a multi-layered film of at least three layers, including at least one low-transmission layer having a principal function of transmittance control, and at least one high-transmission layer having a principal function of phase shift control, the extinction coefficient $K_3$ of the low-transmission layer and the extinction coefficient $K_4$ of the high-transmission layer satisfy $K_4<K_2\leq 3.0$ at an exposure light wavelength falling between 140 nm and 200 nm, and the thickness $d_3$ of the low-transmission layer satisfies $0.001\leq K_3 d_3/\lambda \leq 0.500$ at the exposure light wavelength $\lambda$.

(Eighth Aspect of the Invention)

The halftone phase-shift mask blank of the seventh aspect of the invention, which satisfies $0.010\leq K_3 d_3/\lambda \leq 0.500$ at $\lambda$ of ArF excimer laser of around 193 nm.

(Ninth Aspect of the Invention)

The halftone phase-shift mask blank of the seventh aspect of the invention, which satisfies $0.001\leq K_3 d_3/\lambda \leq 0.250$ at $\lambda$ of $F_2$ excimer laser of around 157 nm.

(Tenth Aspect of the Invention)

The halftone phase-shift mask blank of the seventh aspect of the invention, wherein the high-transmission layer having a refractive index of $n_4$ and an extinction coefficient of $K_4$ satisfies $n_4\geq 1.5$ and $K_4\leq 0.45$ at the exposure light wavelength $\lambda$ falling between 140 nm and 200 nm.

(Eleventh Aspect of the Invention)

The halftone phase-shift mask blank of the tenth aspect of the invention, which satisfies $n_4\geq 1.7$ and $K_4\leq 0.45$ at $\lambda$ of ArF excimer laser of around 193 nm.

(Twelfth Aspect of the Invention)

The halftone phase-shift mask blank of the tenth aspect of the invention, which satisfies $n_4 \geq 1.5$ and $K_4 \leq 0.40$ at of $F_2$ excimer laser of around 157 nm.

(Thirteenth Aspect of the Invention)

A halftone phase-shift mask with a mask pattern comprising a light-transmissive part and a phase shifter part, which is obtained by selectively patterning the phase shifter film in the halftone phase-shift mask blank of the first aspect of the invention to make it have a desired pattern.

(Fourteenth Aspect of the Invention)

A pattern transfer method of using the halftone phase-shift mask of the thirteenth aspect of the invention for transferring patterns.

In the invention, the "high-transmission layer" and the "low-transmission layer" are to indicate a relative transmission difference between the layers compared with each other, and the extinction coefficient of the low-transmission layer is larger than that of the high-transmission layer.

(Fifteenth Aspect of the Invention)

A halftone phase-shift mask blank for halftone phase-shift masks having, on a transparent substrate, a light-transmissive part that transmit the exposure light, and a phase shifter part that transmits a part of the exposure light and shifts the phase of the transmitted light to a predetermined degree; the mask blank having a phase shifter film to form the phase shifter part on the transparent substrate being characterized in that, the phase shifter film is a four-layered or more multi-layered film composed of first, second . . . and nth layers laminated in that order on the substrate, the odd-number layers are high-refraction layers of at least one selected from metals and their oxides, nitrides, nitroxides and silicon compounds, having a principal function of transmittance control, and the even-number layers are low-refraction layers of a silicon oxide or nitroxide, having a principal function of phase shift control.

(Sixteenth Aspect of the Invention)

The halftone phase-shift mask blank of the fifteenth aspect of the invention, wherein the total thickness of all the odd-number layers of the multi-layered film to form the phase shifter film is at most 200 angstroms.

(Seventeenth Aspect of the Invention)

The halftone phase-shift mask blank of the fifteenth aspect of the invention, which is processed through exposure to light of $F_2$ excimer laser of around 157 nm.

(Eighteenth Aspect of the Invention)

A halftone phase-shift mask with a mask pattern comprising a light-transmissive part and a phase shifter part, which is obtained by selectively patterning the phase shifter film in the halftone phase-shift mask blank of the fifteentha aspect of the invention to make it have a desired pattern.

(Nineteenth Aspect of the Invention)

A halftone phase-shift mask blank for halftone phase-shift masks having, on a transparent substrate, a light-transmissive part that transmit the exposure light, and a phase shifter part that transmits a part of the exposure light and shifts the phase of the transmitted light to a predetermined degree; the mask blank having a phase shifter film to form the phase shifter part on the transparent substrate being characterized in that, the phase shifter film is so planned that it is a four-layered or more multi-layered film of alternately-laminated high-refraction layers having a principal function of transmittance control and low-refraction layers having a principal function of phase shift control and at least one low-refraction layer in the film has a function of antireflection at least against the exposure light.

(Twentieth Aspect of the Invention)

The halftone phase-shift mask blank of the nineteenth aspect of the invention, wherein the multi-layered phase shifter film is composed of first, second . . . and nth layers laminated in that order on the substrate, the odd-number layers are high-refraction layers, and the even-number layers are low-refraction layers.

(Twenty-First Aspect of the Invention)

The halftone phase-shift mask blank of the nineteenth aspect of the invention, wherein the material of the high-refraction layers is at least one selected from metals, transition metals and their oxides, nitrides, nitroxides and silicon compounds, and the material of the low-refraction layers is a silicon oxide or nitroxide.

(Twenty-Second Aspect of the Invention)

The halftone phase-shift mask blank of the nineteenth aspect of the invention, wherein the total thickness of all the high-refraction layers is at most 200 angstroms.

(Twenty-Third Aspect of the Invention)

The halftone phase-shift mask blank of the nineteenth aspect of the invention, wherein the exposure light being $F_2$ excimer laser of wavelength around 157 nm.

(Twenty-Fourth Aspect of the Invention)

A halftone phase-shift mask with a mask pattern comprising a light-transmissive part and a phase shifter part, which is obtained by selectively patterning the phase shifter film in the halftone phase-shift mask blank of any of nineteenth aspect to twenty-third aspect to make it have a desired pattern.

(Twenty-Fifth Aspect of the Invention)

The halftone phase-shift mask of the twenty-fourth aspect of the invention, which is used for the exposure light in a wavelength range of around 157 nm of $F_2$ excimer laser.

(Twenty-Sixth Aspect of the Invention)

A pattern transfer method of using the halftone phase-shift mask of any of eighteenth aspect, twenty-fourth aspect or twenty-fifth aspect for transferring patterns.

DESCRIPTION OF THE PREFERRED EMBODIMENTS

In the first aspect of the invention in which the extinction coefficient $K_1$ of the low-transmission layer and the thickness $d_1$ thereof are specifically defined in point of the ratio of $K_1 d_1/\lambda$, the high-transmission layer is free from the problem of transmittance reduction with it in the vacuum UV region of $\lambda$ falling between 140 and 200 nm, and therefore the halftone phase-shift mask ensures a satisfactory transmittance of from 3% to 40% necessary for it.

As opposed to this, when the extinction coefficient $K_1$ of the low-transmission layer is larger than 3.0, $K_1 > 3.0$, at the exposure wavelength $\lambda$ falling between 140 nm and 200 nm, or when the thickness $d_1$ of the low-transmission layer is such that $K_1 d_1/\lambda > 0.500$ at the exposure wavelength $\lambda$ falling between 140 nm and 200 nm, the halftone phase-shift mask cannot ensure a satisfactory transmittance of from 3% to 40% necessary for it.

When the extinction coefficient $K_1$ of the low-transmission layer is such that $K_1 d_1/\lambda < 0.001$ at the exposure wavelength λ falling between 140 nm and 200 nm, the transmittance is too high for the halftone phase-shift mask.

From the conditions as above, metal films, metal nitride films and metal nitroxide films containing, as the essential ingredient, at least one selected from Si, Ti, Cr, Ta, Zr, Mo, V, Nb, W and Al are preferred for the material of the low-transmission layer. Of those, especially preferred are films of Ti, Cr, Ta, Al, Zr, $TaN_x$, $CrN_x$, $TiN_x$, $AlN_x$ or $ZrN_x$, as they are easy to form and work.

The order of the low-transmission layer and the high-transmission layer to be laminated is not specifically defined, or that is, any of the layers may be an upper layer. However, for reducing the reflectance of the mask, the high-transmission layer is preferably the uppermost layer.

In the second aspect of the invention, the ratio $K_1 d_1/\lambda$ is specifically so defined that the mask ensures the desired phase shift and the desired transmittance at the exposure wavelength of ArF excimer laser of around 193 nm.

More preferably, $0.040 \leq K_1 d_1/\lambda \leq 0.300$, in view of the transmittance of the mask. Also more preferably, $0.010 \leq K_1 \leq 2.50$, in view of the phase shift of the mask.

In the third aspect of the invention, the ratio $K_1 d_1/\lambda$ is specifically so defined that the mask ensures the desired phase shift and the desired transmittance at the exposure wavelength of $F_2$ excimer laser of around 157 nm.

More preferably, $0.040 \leq K_1 d_1/\lambda \leq 0.200$, in view of the transmittance of the mask. Also more preferably, $0.010 \leq K_1 \leq 2.70$, in view of the phase shift of the mask.

In the fourth aspect of the invention that is subsidiary to the first aspect of the invention, the high-transmission layer having a refractive index of $n_2$ and an extinction coefficient of $K_2$ is defined to satisfy $n_2 \geq 1.5$ and $K_2 \leq 0.45$ at the exposure wavelength λ falling between 140 nm and 200 nm. Thus defined, the mask of this aspect of the invention ensures the intended phase shift and the intended transmittance.

As opposed to this, when $K_2 > 0.45$, the halftone phase-shift mask could not have a transmittance of from 3% to 40% necessary for it.

When $n_2 < 1.5$, the thickness of the high-transmission layer for attaining the necessary phase shift will be too large. This is problematic in that the aspect ratio of the pattern profile in the patterned mask is large, or that is, the cross section of the pattern profile is narrow and high and the pattern profile is unstable.

From the conditions as above, $SiO_x N_y$, $SiO_x$, $CaF_2$ and $MgF_2$ are preferred for the material of the high-transmission layer. These may contain trace metals and microelements.

In the fifth aspect of the invention, $K_2$ and $n_2$ of the high-transmission layer are specifically so defined that the mask ensures the desired phase shift and the desired transmittance at the exposure wavelength of ArF excimer laser of around 193 nm.

More preferably, $n_2 \geq 2.0$, in view of the phase shift of the mask. Also more preferably, $K_2 \leq 0.40$, in view of the transmittance of the mask.

In the sixth aspect of the invention, $K_2$ and $n_2$ of the high-transmission layer are specifically so defined that the mask ensures the desired phase shift and the desired transmittance at the exposure wavelength of $F_2$ excimer laser of around 157 nm.

More preferably, $n_2 \geq 1.7$, in view of the phase shift of the mask. Also more preferably, $K_2 \leq 0.38$, in view of the transmittance of the mask.

The seventh aspect to twelfth aspect differ from the first to sixth aspect only in that the phase shifter film therein is a multi-layered film of at least three layers laminated in a desired manner. In these, the high-transmission layer is free from the problem of transmittance reduction with it in the vacuum UV region of λ falling between 140 and 200 nm, and therefore the halftone phase-shift mask ensures a satisfactory transmittance of from 3% to 40% necessary for it.

Regarding its embodiments, the multi-layered phase shifter film in these aspects of the invention may have a structure of alternately laminated low-transmission layer and high-transmission layer, or may partly have a laminate structure of two or more low-transmission or high-transmission layers directly laminated on each other with no other layer therebetween.

In these, the order of the low-transmission layer and the high-transmission layer to be laminated is not specifically defined, or that is, any of the layers may be an upper layer. However, for reducing the reflectance of the mask, the high-transmission layer is preferably the uppermost layer.

In the multi-layered film having at least two low-transmission or high-transmission layers, at least two low-transmission layers may be the same or different in point of the material and the composition thereof. Similarly, at least two high-transmission layers therein may also be the same or different in point of the material and the composition thereof.

In the halftone phase-shift mask blank of the fifteenth aspect of the invention, in which the phase shifter film is a four-layered or more multi-layered film composed of first, second . . . and nth layers laminated in that order on the substrate, and in which the odd-number layers are high-refraction layers of at least one selected from metals, transition metals and their oxides, nitrides, nitroxides and silicon compounds, having a principal function of transmittance control and the even-number layers are low-refraction layers of a silicon oxide or nitroxide, having a principal function of phase shift control, the transmittance of the phase shifter film (semi-transmissive film) within a vacuum UV range of from 140 to 200 nm, especially at the wavelength of $F_2$ excimer laser of 157 nm falls between 3 and 40% (preferably between 3 and 20%) necessary for the mask.

Controlling the order of the constituent layers to be laminated and the thickness of each layer enables reflectance control (reduction) of the phase shifter film necessary for increasing the accuracy in mask inspection and in actual exposure. The reflectance of the film is preferably at most 40% (more preferably at most 20%) in a vacuum UV range of from 140 to 200 nm (especially at around 157 nm or around 193 nm) and at around 248 nm.

In the fifteenth aspect of the invention in which the layer just above the substrate is a high-refraction layer, the etching endpoint of the layer is easy to detect by measuring the quantity of light reflected on the substrate (since the refractive index of the substrate is low), and the phase difference in the etched structure can be accurately controlled since the substrate is prevented from being etched. As opposed to this, in case where the layer just above the substrate is a low-refraction layer, the etching end point of the layer is difficult to detect by measuring the quantity of light reflected on the substrate, and even after the low-refraction layer just above the substrate has been etched to the intended degree, etching it will be further continued, and as a result, even the substrate will be etched. If so, the phase difference in the etched structure will be larger than 180 degrees, and the phase-shift mask could not enjoy improved resolution.

In the invention, the "high-refraction layer" and the "low-refraction layer" are to indicate a relative refraction difference between the layers compared with each other.

In the fifteenth aspect to eighteenth aspect of the invention, the odd-number layers may be the same or different in point of the material and the composition thereof. The same shall apply to the even-number layers therein. For example, the material and the composition of the first high-refraction layer may be so designed that the layer serves as an etching stopper for the low-refraction layer just above it; and the material and the composition of the third and upper high-refraction layers may be so designed that the layers are easy to etch.

If desired, any one or more high-refraction layers in the multi-layered film may have a multi-layered structure of two or more high-refraction layers. In this case, the two or more high-refraction layers constituting the multi-layered structure may be the same or different in point of the material and the composition thereof. The same shall apply to the low-refraction layers.

Preferably, the uppermost layer in the multi-layered film is a low-refraction layer. If the uppermost layer is a high-refraction layer, it produces primary reflection thereon, and the reflectance of the multi-layered film could not be reduced.

The material for the odd-number high-refraction layers in the invention includes, for example, tantalum, chromium, titanium, aluminium, vanadium, zirconium, niobium, molybdenum, lanthanum, tungsten, silicon, and their nitrides, nitroxides, oxides and silicon compounds. One or more of these may be used singly or as combined for the film of the layers. Of these, especially preferred are Ti, Cr, Ta, Al, Zr, $TaN_x$, $CrN_x$, $TiN_x$, $AlN_x$ and $ZrN_x$, as they can be readily formed into layers and their layers are easy to work.

The even-number low-refraction layers in the invention are formed of $SiO_xN_y$ or $SiO_x$, which may contain trace metals or trace elements.

The halftone phase-shift mask blank of the invention may have any other films (e.g., light-shielding film) in addition to the phase shifter film.

In the sixteenth aspect of the invention, the total thickness of all the odd-number layers of the multi-layered film to form the phase shifter film is at most 200 angstroms. The transmittance of the mask blank of this aspect of the invention is at least 3% even in a vacuum UV wavelength range of from 140 to 200 nm, especially at wavelength of 157 nm of $F_2$ excimer laser.

If the total thickness of all the odd-number layers of the multi-layered film is larger than 200 angstroms, the transmittance of the mask blank could not be at least 3% at 157 nm of $F_2$ excimer laser.

Preferably, the thickness of the first layer is at least 50 angstroms. If smaller than 50 angstroms, it is unfavorable since the substrate could not be completely prevented from being etched and significant reflectance change could not be detected in processing the mask blank.

The nineteenth aspect of the invention is so planned that the phase shifter film therein is a four-layered or more multi-layered film of alternately-laminated high-refraction layers having a principal function of transmittance control and low-refraction layers having a principal function of phase shift control and at least one low-refraction layer in the film has a function of antireflection at least against the exposure light. Having the aspect of the invention, the phase-shift mask enjoys improved antireflection at least against the exposure light that enters it through its surface (the film side) and its back (substrate side).

Ideally, the "multi-layered phase shifter film which is so planned that at least one low-refraction layer therein has a function of antireflection against the exposure light" satisfies the condition of nd=$\lambda$/4× odd number (odd-number times the value of $\lambda$/4), in which n indicates the refractive index of the film that forms each low-refraction layer and d indicates the thickness thereof. However, it is not true that the phase shifter film could not have the antireflection function at all if it does not completely satisfy that formula. Therefore, in the nineteenth aspect of the invention, nd may fall within a range of around $\lambda$/4× odd number (±15%).

Preferably, at least one low-refraction layer in the nineteenth aspect of the invention has the antireflection function against inspection light.

In case where at least the low-refraction layer nearest to the substrate has the antireflection function against the exposure light, it is more effective for reducing the reflectance of the back (transparent substrate) of the phase-shift mask. By reducing the reflectance of the back of the phase-shift mask, the exposure light incident on the transparent substrate of the mask in a process of pattern transfer with the mask is prevented from reflecting thereon.

In this case, the "low-refraction layer nearest to the transparent substrate" is meant to indicate the low-refraction layer that is nearest to the transparent substrate coated with first, second . . . nth layers, and it may be the first layer or the second layer. Preferably, however, the layer is the second layer in order to prevent the substrate from being etched in the dry-etching process mentioned below and to thereby surely control the phase difference in the mask.

Also preferably, at least the uppermost low-refraction layer has the antireflection function against the exposure light for more effectively reducing the reflectance of the surface of the phase-shift mask. By reducing the reflectance of the surface of the phase-shift mask, the light reflected on the substrate of a substance to be patterned in a process of pattern transfer with the mask is prevented from re-reflecting on the mask.

In this case, the "uppermost low-refraction layer" is meant to indicate the low-refraction layer that is nearest to the outermost layer of the multi-layered film, and it may be the outermost layer itself of the film or may be lower than the outermost layer of the film. Preferably, however, the layer is the outermost layer. This is because, if the outermost layer of the film is a high-refraction layer, it produces primary reflection thereon, and the reflectance of the film could not be reduced.

In the twentieth aspect of the invention in which the layer just above the substrate is a high-refraction layer, the etching endpoint of the layer is easy to detect by measuring the quantity of light reflected on the substrate (since the refractive index of the substrate is low), and the phase difference in the etched structure can be accurately controlled since the substrate is prevented from being etched. As opposed to this, in case where the layer just above the substrate is a low-refraction layer, the etching end point of the layer is difficult to detect by measuring the quantity of light reflected on the substrate, and even after the low-refraction layer just above the substrate has been etched to the intended degree, etching it will be further continued, and as a result, even the substrate will be etched. If so, the phase difference in the etched structure will be larger than 180 degrees, and the phase-shift mask could not enjoy improved resolution.

In the halftone phase-shift mask blank of the twenty-first aspect of the invention in which the material of the high-refraction layers is at least one selected from metals, transition metals and their oxides, nitrides, nitroxides and silicon compounds, and the material of the low-refraction layers is a silicon oxide or nitroxide, the transmittance of the phase shifter film (semi-transmissive film) within a vacuum UV range of from 140 to 200 nm, especially at the wavelength of $F_2$ excimer laser of 157 nm falls between 3 and 40% (preferably between 3 and 20%) necessary for the mask.

Controlling the order of the constituent layers to be laminated and the thickness of each layer enables controlling (reducing) the reflection of exposure light on the phase shifter film, and the reflectance control of the film is necessary for increasing the accuracy in actual exposure of the mask blank to light. In addition, controlling the order of the constituent layers to be laminated and the thickness of each layer also enables controlling (reducing) the reflection of mask inspection light on the mask.

The reflectance of the film is preferably at most 40% (more preferably at most 20%) in a vacuum UV range of from 140 to 200 nm (especially at around 157 nm or around 193 nm) and at around 248 nm.

In the twenty-second aspect of the invention, the total thickness of all the high-refraction layers is at most 200 angstroms. The transmittance of the mask blank of this aspect of the invention is at least 3% even in a vacuum UV wavelength range of from 140 to 200 nm, especially at wavelength of 157 nm of $F_2$ excimer laser.

If the total thickness of all the high-refraction layers is larger than 200 angstroms, the transmittance of the mask blank could not be at least 3% at 157 nm of $F_2$ excimer laser.

Preferably, the thickness of the high-refraction layer (first layer) just above the transparent substrate is at least 50 angstroms. If smaller than 50 angstroms, it is unfavorable since the substrate could not be completely prevented from being etched and significant reflectance change could not be detected in processing the mask blank.

Satisfying any of the nineteenth aspect to twenty-second aspect of the invention, the halftone phase-shift mask blank of the twenty-third aspect of the invention is well processed through exposure to light of $F_2$ excimer laser of wavelength around 157 nm, and its properties including the reflectance, the transmittance and the phase shift degree all satisfy the requirement for halftone phase-shift masks.

In the nineteenth aspect of the invention to twenty-third of the invention, the high-refraction layers may be the same or different in point of the material and the composition thereof. The same shall apply to the low-refraction layers therein. For example, the material and the composition of the first high-refraction layer may be so designed that the layer serves as an etching stopper for the low-refraction layer just above it; and the material and the composition of the third and upper high-refraction layers may be so designed that the layers are easy to etch.

Regarding its embodiments, the multi-layered phase shifter film in these aspects of the invention may have a structure of alternately laminated low-refraction layers and high-refraction layers, or may partly have a laminate structure of two or more low-refraction or high-refraction layers directly laminated on each other with no other layer therebetween.

The material for the high-refraction layers in the invention includes, for example, tantalum, chromium, titanium, aluminium, vanadium, zirconium, niobium, molybdenum, lanthanum, tungsten, silicon, and their nitrides, nitroxides, oxides and silicon compounds. One or more of these may be used singly or as combined for the film of the layers. Of these, especially preferred are Ti, Cr, Ta, Al, Zr, $TaN_x$, $CrN_x$, $TiN_x$, $AlN_x$ and $ZrN_x$, as they can be readily formed into layers and their layers are easy to work.

Preferably, the low-refraction layers in the invention are formed of $SiO_xN_y$ or $SiO_x$, which may contain minor metals or minor elements.

The halftone phase-shift mask blank of the invention may have any other films (e.g., light-shielding film) in addition to the phase shifter film.

Examples of the invention are described below.

EXAMPLES 1 TO 7, COMPARATIVE EXAMPLES 1 TO 3

Examples 1 to 7 and Comparative Examples 1 to 3 are of halftone phase-shift mask blanks to be processed through exposure to $F_2$ excimer laser of around 157 nm.

In Examples 1 to 6 and Comparative Examples 1 to 3, a low-transmission layer of the material shown in Table 1 below was formed on a transparent $CaF_2$ substrate through RF reactive sputtering, using the corresponding metal target and reactive gas.

Next, a high-transmission layer of $SiO_xN_y$ was formed on the low-transmission layer, using an Si target. The reactive gas used was a mixture of nitrogen and oxygen. A two-layered phase shifter film was thus formed on the substrate.

In the two-layered film, the thickness of each layer was so controlled that the masks to be produced herein could ensure a phase shift of 180° at 157 nm. In forming the $SiO_xN_y$ film, the quantity of the reactive gas of nitrogen and oxygen was so controlled that the film formed could have a refractive index n of 2.2 and an extinction coefficient K of 0.2 at 157 nm.

The phase shifter film in Example 7 is a multi-layered film. Concretely, this is a four-layered film composed of two low-transmission layers and two high-transmission layers alternately laminated, in which each low-transmission layer is of the material of Table 1 and each high-transmission layer is a layer of $SiO_xN_y$ having a refractive index n of 2.2 and an extinction coefficient K of 0.2 like in Examples 1 to 6.

Using an ellipsometer, the extinction coefficient K of the low-transmission layer in these Examples and Comparative Examples was measured. The data K and Kd/λ are shown in Table 2. Using a vacuum UV spectrometer, the transmittance and the reflectance of the two-layered film and the four-layered film at 157 nm were measured. The data are shown in Table 2. d indicates the thickness (nm) of the single low-transmission layer or the total thickness (nm) of the laminated low-transmission layers; and λ indicates the wavelength of $F_2$ excimer laser, 157 nm.

TABLE 1

| | Material of Low-Transmission Layer |
|---|---|
| Example 1 | Cr |
| Example 2 | Ta |
| Example 3 | Ti |
| Example 4 | CrNx |
| Example 5 | TaNx |
| Example 6 | TiNx |
| Example 7 | TaNx |
| Comparative Example 1 | Cr-based film |
| Comparative Example 2 | TiNx |
| Comparative Example 3 | $SiO_xN_y$ |

TABLE 2

|  | Extinction Coefficient K of Low-Transmission Layer (157 nm) | Kd/λ of Low-Transmission Layer (157 nm) | Transmittance (%) (157 nm) | Reflectance (%) (157 nm) |
|---|---|---|---|---|
| Example 1 | 1.52 | 0.0775 | 7.86 | 10.09 |
| Example 2 | 2.01 | 0.1255 | 5.08 | 11.11 |
| Example 3 | 1.27 | 0.0809 | 7.35 | 9.09 |
| Example 4 | 1.45 | 0.1016 | 8.80 | 9.48 |
| Example 5 | 1.23 | 0.0627 | 13.85 | 18.30 |
| Example 6 | 1.73 | 0.1179 | 5.39 | 11.95 |
| Example 7 | 2.01 | 0.1152 | 11.54 | 8.94 |
| Comp. Ex. 1 | 1.52 | 0.2904 | 2.60 | — |
| Comp. Ex. 2 | 1.73 | 0.3306 | 1.57 | — |
| Comp. Ex. 3 | 0.35 | smaller than 0.001 | larger than 40 | — |

As in Table 2, Examples 1 to 7 all have a transmittance falling within a range of from 3 to 40% at 157 nm sufficient for halftone phase-shift masks. On the other hand, Comparative Examples 1 and 2, in which Kd/λ of the low-transmission layer is large, do not have a satisfactory transmittance. Contrary to these, the transmittance of Comparative Example 3 is too large since Kd/λ of the low-transmission layer therein is small, and Comparative Example 3 is unsuitable for halftone phase-shift masks. In Comparative Example 3, the low-transmission layer of $SiO_xN_y$ differs from the high-transmission layer of $SiO_xN_y$ in that the nitrogen content of the former is larger than that of the latter.

In addition, it has been confirmed that, when the oxygen content of the high-transmission layer of $SiO_xN_y$ is reduced so as to make the extinction coefficient K of the high-transmission layer larger than 0.40, K>0.40, at 157 nm, the mask blanks could not have a satisfactory transmittance. It has been further confirmed that, when the refractive index n of the high-transmission layer is smaller than 1.5, n<1.5, at 157 nm, the thickness of the high-transmission layer must be greatly increased for attaining the necessary phase shift, and, if so, the aspect ratio of the pattern profile in the patterned masks is high and the pattern profile therein is unstable.

EXAMPLES 8 TO 10, COMPARATIVE EXAMPLES 4 AND 5

Examples 8 to 10 and Comparative Examples 4 and 5 are of halftone phase-shift mask blanks to be processed through exposure to ArF excimer laser of around 193 nm.

In Examples 8 and 10 and Comparative Examples 4 and 5, a low-transmission layer of the material shown in Table 3 below was formed on a transparent $CaF_2$ substrate through RF reactive sputtering, using the corresponding metal target and reactive gas.

Next, a high-transmission layer of $SiO_xN_y$ was formed on the low-transmission layer, using an Si target. The reactive gas used was a mixture of nitrogen and oxygen. A two-layered phase shifter film was thus formed on the substrate.

In the two-layered film, the thickness of each layer was so controlled that the masks to be produced herein could ensure a phase shift of 180° at 193 nm. In forming the $SiO_xN_y$ film, the quantity of the reactive gas of nitrogen and oxygen was so controlled that the film formed could have a refractive index n of 2.2 and an extinction coefficient K of 0.11 at 193 nm.

Using an ellipsometer, the extinction coefficient K of the low-transmission layer in these Examples and Comparative Examples was measured. The data K and Kd/λ are shown in Table 4. Using a vacuum UV spectrometer, the transmittance and the reflectance of the two-layered film at 193 nm were measured. The data are shown in Table 4. d indicates the thickness (nm) of the low-transmission layer; and λ indicates the wavelength of ArF excimer laser, 193 nm.

TABLE 3

|  | Material of Low-Transmission Layer |
|---|---|
| Example 8 | CrNx |
| Example 9 | TaNx |
| Example 10 | TiNx |
| Comparative Example 4 | Cr-based film |
| Comparative Example 5 | Cr-based film |

TABLE 4

|  | Extinction Coefficient K of Low-Transmission Layer (193 nm) | Kd/λ of Low-Transmission Layer (193 nm) | Transmittance (%) (193 nm) | Reflectance (%) (193 nm) |
|---|---|---|---|---|
| Example 8 | 1.58 | 0.0979 | 13.58 | 12.11 |
| Example 9 | 1.33 | 0.0828 | 17.24 | 6.07 |
| Example 10 | 1.68 | 0.1050 | 13.32 | 12.45 |
| Comp. Ex. 4 | 2.63 | 0.5450 | 1.12 | 15.47 |
| Comp. Ex. 5 | 2.63 | 0.00237 | 43.89 | 10.35 |

As in Table 4, Examples 8 to 10 all have a transmittance at 193 nm suitable for halftone phase-shift masks. On the other hand, Comparative Example 4, in which Kd/λ is large, do not have a satisfactory transmittance. Contrary to this, the transmittance of Comparative Example 5 is too large since Kd/λ is small, and Comparative Example 5 is unsuitable for halftone phase-shift masks.

In addition, it has been confirmed that, when the oxygen content of the high-transmission layer of $SiO_xN_y$ is reduced so as to make the extinction coefficient K of the high-transmission layer larger than 0.45, K>0.45, at 193 nm, the mask blanks could not have a satisfactory transmittance. It has been further confirmed that, when the refractive index n of the high-transmission layer is smaller than 1.7, n<1.7, at 193 nm, the thickness of the high-transmission layer must be greatly increased for attaining the necessary phase shift, and, if so, the aspect ratio of the pattern profile in the patterned masks is high and the pattern profile therein is unstable.

The invention is not limited to the range of the Examples mentioned above.

For example, the invention is not limited to the materials and the film-forming conditions in the Examples.

For the sputtering gas in forming the constituent layers, usable is any of nitrogen, oxygen and other various nitrogen sources and oxygen sources such as nitrogen monoxide, nitrogen dioxide and dinitrogen monoxide, as well as mixed gases thereof with inert gas such as argon or xenon. The sputtering method is not specifically defined. For example, the system of power application to the sputtering device (RF, DC, etc.), the sputtering output, the vapor pressure, and also the substrate heating system, if used, may be suitably selected, depending on the targets and the gases to be used and on the intended properties of the films to be formed.

For the substrate material, usable are any others such as high-purity quartz, etc.

EXAMPLES 11 TO 17, COMPARATIVE EXAMPLE 6

Film Formation

In Examples 11 and 12, four layers of alternate $TaN_x$ and $SiO_xN_y$ (refractive index n=2.0) were laminated in that order on a transparent substrate through RF sputtering. The layers of $TaN_x$ were formed, using a Ta target and a sputtering gas of Ar and $N_2$. The layers of $SiO_xN_y$ were formed, using an Si target and a sputtering gas of Ar, $N_2$ and $O_2$.

Example 13 differs from Examples 11 and 12 in that it has layers of $SiO_x$ in place of the layers of $SiO_xN_y$. In Example 13, four layers of alternate $TaN_x$ and $SiO_x$ (refractive index n=1.66) were laminated in that order on a substrate. The layers of $SiO_x$ were formed, using an $SiO_2$ target and a sputtering gas of Ar.

Example 14 differs from Examples 11 and 12 in that it has layers of Ta in place of the layers of $TaN_x$. In Example 14, four layers of alternate Ta and $SiO_xN_y$ were laminated in that order on a substrate. The layers of Ta were formed, using a Ta target and a sputtering gas of Ar.

Example 15 differs from Examples 11 and 12 in that it has layers of $CrN_x$ in place of the layers of $TaN_x$. In Example 15, four layers of alternate $CrN_x$ and $SiO_xN_y$ were laminated in that order on a substrate. The layers of $CrN_x$ were formed, using a Cr target and a sputtering gas of Ar and $N_2$.

Example 16 differs from Example 11 only in point of the order of layer lamination. In Example 16, four layers of alternate $SiO_xN_y$ and $TaN_x$ were laminated in that order on a substrate.

Example 17 differs from Example 13 only in point of thickness of the SiOx layers.

Comparative Example 6 differs from Example 1 only in that the thickness of the second and fourth low-refraction layers was varied.

The thickness of each layer in these Examples and Comparative Example is shown in Table 5. Based on formula (1) mentioned above, the constituent layers of every four-layered film prepared herein were so controlled that the sum total of the phase shift through the layers could be 180° at a wavelength 157 nm of $F_2$ excimer laser. The 2nd low-refraction layer in Examples 11 and 13 to 15, and the 4th low-refraction layer in Example 12 were so planned in point of their thickness, material and composition that they satisfy the condition of nd falling within a range of around λ/4× odd number (±15%), where each of those layers has a refractive index of "n" and a thickness of "d". In Comparative Example 6, however, the thickness, d, of the 2nd and 4th low-refraction layers (refractive index: n) was varied so as to make nd overstep the range of around λ/4× odd number (±15%)

TABLE 5

|  | 1st Layer | 2nd Layer | 3rd Layer | 4th Layer |
| --- | --- | --- | --- | --- |
| Example 11 | TaNx: 50 Å | SiOxNy: 200 Å | TaNx: 30 Å | SiOxNy: 600 Å |
| Example 12 | TaNx: 50 Å | SiOxNy: 600 Å | TaNx: 30 Å | SiOxNy: 200 Å |
| Example 13 | TaNx: 50 Å | SiOx: 250 Å | TaNx: 30 Å | SiOx: 950 Å |
| Example 14 | Ta: 50 Å | SiOxNy: 200 Å | Ta: 30 Å | SiOxNy: 600 Å |
| Example 15 | CrNx: 50 Å | SiOxNy: 200 Å | CrNx: 30 Å | SiOxNy: 600 Å |
| Example 16 | SiOxNy: 200 Å | TaNx: 50 Å | SiOxNy: 600 Å | TaNx: 30 Å |
| Example 17 | TaNx: 50 Å | SiOx: 350 Å | TaNx: 30 Å | SiOx: 850 Å |
| Comp. Example 6 | TaNx: 50 Å | SiOxNy: 380 Å | TaNx: 50 Å | SiOxNy: 380 Å |

Optical Properties

Using a vacuum UV spectrometer, the transmittance and the surface reflectance of the samples produced in Examples and Comparative Examples were measured. The data at 157 nm, 193 nm and 248 nm are shown in Table 6. The back surface transmittance and the back surface reflectance of the sample of Example 11 was measured in the same manner, and the data are shown in Table 7.

TABLE 6

|  | Transmittance (%) (157 nm) | Surface Reflectance (%) (157 nm) | Transmittance (%) (193 nm) | Surface Reflectance (%) (193 nm) | Transmittance (%) (248 nm) | Surface Reflectance (%) (248 nm) |
| --- | --- | --- | --- | --- | --- | --- |
| Example 11 | 11.54 | 8.95 | 27.06 | 9.93 | 32.77 | 15.25 |
| Example 12 | 11.21 | 3.24 | 31.31 | 1.58 | 35.92 | 18.41 |
| Example 13 | 19.01 | 12.31 | 28.30 | 4.64 | 33.22 | 4.39 |
| Example 14 | 5.08 | 11.11 | 21.98 | 6.03 | 27.07 | 18.17 |
| Example 15 | 8.80 | 9.48 | 31.73 | 7.56 | 40.61 | 14.24 |
| Example 16 | 10.70 | 12.50 | 28.09 | 23.13 | 32.93 | 30.63 |
| Example 17 | 19.01 | 10.23 | 28.30 | 9.37 | 33.22 | 4.77 |
| Comp. Example 6 | 7.34 | 23.73 | 23.82 | 10.51 | 27.80 | 2.91 |

TABLE 7

|  | Transmittance (%) (157 nm) | Back Surface Reflectance (%) (157 nm) | Transmittance (%) (193 nm) | Back Surface Reflectance (%) (193 nm) | Transmittance (%) (248 nm) | Back Surface Reflectance (%) (248 nm) |
| --- | --- | --- | --- | --- | --- | --- |
| Example 11 | 11.21 | 11.75 | 26.52 | 13.08 | 33.07 | 8.81 |

Table 6 confirms that the samples of Examples 11 to 17 all satisfy the transmittance falling between 3 and 40% at 157 nm necessary and sufficient for halftone phase-shift masks. When the thickness of the constituent layers of these samples was suitably varied, the reflectance at around 157 nm of the samples was lower than the acceptable level of 20%. Table 6 further confirms that the reflectance of the samples of Examples 11 to 15 and 17 at around 193 nm and at the current inspection wavelength of around 248 nm was reduced.

Comparing Example 11 and Example 12, it is understood that the sample of Example 12, which was so planned that the low-refraction layer nearer to the surface thereof satisfies the condition of nd falling within a range of around $\lambda/4 \times$ odd number, has a lower surface reflectance.

Table 7 confirms that the back surface reflectance of the sample, which was so planned that the low-refraction layer nearer to the transparent substrate thereof satisfies the condition of nd falling within a range of around $\lambda/4 \times$ odd number, is reduced.

In Comparative Example 6, the thickness of the 2nd and 4th low-refraction layers was not defined in consideration of the reflectance of the sample. Therefore, the reflectance of the sample of Comparative Example 11 at around 157 nm could not be reduced.

In Example 16, differently from Example 11 to 15 and 17, four layers of alternate $SiO_xN_y$ and $TaN_x$ were laminated in that order on a substrate. Due tot his, the reflectance at 193 nm and 248 nm are high, though the reflectance at 157 nm is well reduced.

Dry Etching

A single-layer film of $TaN_x$, $SiO_xN_y$ or $SiO_x$ was formed on a transparent quartz substrate under the same condition as in Examples 11 and 12. These samples and the quartz substrate were etched in a mode of reactive dry etching (RIE). The etching gas used is $Cl_2$. From the etching rate of each single-layer film, the etching selectivity of each film relative to the quartz substrate was obtained. The data are shown in Table 8.

TABLE 8

| Film Composition | Etching Selectivity relative to Quartz Substrate |
| --- | --- |
| TaNx | 7.56 |
| SiOxNy | 1.33 |
| SiOx | 1.07 |

The etching selectivity of the layer $TaN_x$ just above the quartz substrate is sufficiently high, relative to the substrate. This means that, when the $TaN_x$ layer of the $TaN_x$-coated quartz substrate is etched, the substrate is etched little and therefore the phase shift of the etched $TaN_x$ layer changes little. In addition, since the reflectance of $TaN_x$ at the etching end point detection wavelength 633 nm is at least 15% while that of the quartz substrate is around 6%, the time-dependent reflectance change in etching the layer $TaN_x$ is great and the etching end point is easy to detect. On the other hand, the etching selectivity, relative to the quartz substrate, of the sample with a layer of $SiO_xN_y$ (Example 6) or $SiO_x$ just above the substrate is low. Therefore, when the $SiO_xN_y$ or $SiO_x$-coated sample is etched, even the quartz substrate is etched and the phase shift of the etched sample changes. In addition, since the reflectance of $SiO_xN_y$ at the etching end point detection wavelength 633 nm is around 10%, that of $SiO_x$ is around 6% and that of the quartz substrate is around 6%, the time-dependent reflectance change in etching the layer $SiO_xN_y$ or $SiO_x$ is little and the etching end point is not easy to detect.

The invention is not limited to the range of the Examples mentioned above.

For example, for the sputtering gas in forming the constituent layers, usable is any of nitrogen, oxygen and other various nitrogen sources and oxygen sources such as nitrogen monoxide, nitrogen dioxide and dinitrogen monoxide, as well as mixed gases thereof with inert gas such as argon or xenon. The sputtering method is not specifically defined. For example, the system of power application to the sputtering device (RF, DC, etc.), the sputtering output, the vapor pressure, and also the substrate heating system, if used, may be suitably selected, depending on the targets and the gases to be used and on the intended properties of the films to be formed.

The method of etching the constituting layers may be the same for all the layers, or may be different for the individual layers. For the etching gas, usable is any of fluorine gases such as $CHF_3$, $CF_4$, $SF_6$ or $C_2F_6$, and their mixed gases.

For the substrate material, usable are any others such as $CaF_2$, etc.

As described hereinabove, the invention has solved the problem of transmittance reduction heretofore inevitable in high-transmission layers in conventional two-layered or multi-layered halftone phase-shift masks used in a wavelength range that falls between 140 and 200 nm including $F_2$ excimer layer of 157 nm. Therefore, the invention provides multi-layered halftone phase-shift masks usable in that wavelength range, and mask blanks for them.

As described hereinabove, the invention also provides a multi-layered halftone phase-shift mask which has a suitable transmittance that allows its exposure even to light in a vacuum UV range of from 140 to 200 nm, especially to $F_2$ excimer laser of around 157 nm, and has a reduced reflectance in a broad wavelength range including the light for exposure and the light for mask inspection, and which can be easily dry-etched for phase difference control; and provide a halftone phase-shift mask blank for the mask.

The invention further provides a multi-layered halftone phase-shift mask which has a suitable transmittance that allows its exposure even to light in a vacuum UV range of from 140 to 200 nm, especially to $F_2$ excimer laser of around 157 nm, and which has been specifically so planned that its reflectance to the exposure light may be reduced so as to increase the accuracy in its actual exposure; and provides a halftone phase-shift mask blank for the mask.

What is claimed is:

1. A halftone phase-shift mask blank for halftone phase-shift masks having, on a transparent substrate, a light-transmissive part that transmit an exposure light, and a phase shifter part that transmits a part of the exposure light and shifts the phase of the transmitted light to a predetermined degree; the mask blank having a phase shifter film to form the phase shifter part on the transparent substrate being characterized in that,
the phase shifter film consists of two layers, said two layers respectively comprising a low-transmission layer having a principal function of transmittance control, and a high-transmission layer having a principal function of phase shift control, wherein an uppermost layer is said high-transmission layer,
the extinction coefficient K1 of the low-transmission layer and the extinction coefficient $K_2$ of the high-transmission layer satisfy $K_2<K_1\leq3.0$ at the exposure light wavelength $\lambda$ falling between 140 nm and 200 nm, and the thickness $d_1$ of the low-transmission layer satisfies $0.001\leq K_1 d_1/\lambda\leq 0.500$ at the exposure light wavelength $\lambda$,
wherein the high-transmission layer is SiON.

2. The halftone phase-shift mask blank as claimed in claim 1, which satisfies $0.010\leq K_1 d_1/\lambda \leq 0.500$ at $\lambda$ of ArF excimer laser of approximately 193 rim.

3. The halftone phase-shift mask blank as claimed in claim 1, which satifies $0.001\leq K_1 d_1/\lambda\leq 0.250$ at $\lambda$ of $F_2$ excimer laser of around 157 nm.

4. The halftone phase-shift mask blank as claimed in claim 1, wherein the high-transmission layer having a refractive index of $n_2$ and an extinction coefficient of $K_2$ satisfies $n_2\geq 1.5$ and $K_2\leq 0.45$ at the exposure light wavelength $\lambda$ falling between 140 nm and 200 rm.

5. The halftone phase-shift mask blank as claimed in claim 4, which satisfies $n_2\geq 1.7$ and $K_2\leq 0.45$ at $\lambda$ of ArF excimer laser of approximately 193 nm.

6. The halftone phase-shift mask blank as claimed in claim 4, which satisfies $n_2\geq 1.5$ and $K_2\leq 0.40$ at $\leq$ of $F_2$ excimer laser of approximately 157 nm.

7. A halftone phase-shift mask with a mask pattern comprising a light-transmissive part and a phase shifter part, which is obtained by selectively patterning the phase shifter film in the halftone phase-shift mask blank of claim 1 to make it have a desired pattern.

8. A halftone phase-shift mask blank for halftone phase-shift masks having, on a transparent substrate, a light-transmissive part that transmits an exposure light, and a phase shifter part that transmits a part of the exposure light and shifts the phase of the transmitted light to a predetermined degree; the mask blank having a phase shifter film to form the phase shifter part on the transparent substrate being characterized in that,
the phase shifter film is a multi-layered film of at least three layers; including at least one low-transmission layer having a principal function of transmittance control, and at least one high-transmission layer having a principal function of phase shift control,
the extinction coefficient $K_3$ of the low-transmission layer and the extinction coefficient $K_4$ of the high-transmission layer satisfy $K_4<K_3\leq 3.0$ at the exposure light wavelength $\lambda$ falling between 140 nm and 200 nm,
the thickness $d_3$ of the low-transmission layer satisfies $0.001\leq K_3 d_3/\lambda\leq 0.500$ at the exposure light wavelength $\lambda$, and the high-transmission layer is SiON.

9. The halftone phase-shift mask blank as claimed in claim 8, which satisfies $0.010\leq K_3 d_3/\lambda\leq 0.500$ at $\lambda$ of ArF excimer laser of approximately 193 nm.

10. The halftone phase-shift mask blank as claimed in claim 8, which satisfies $0.010\leq K_3 d_3/\lambda 0.250$ at $\lambda$ of $F_2$ excimer laser of approximately 157 nm.

11. The halftone phase-shift mask blank as claimed in claim 8, wherein the high-transmission layer having a refractive index of $n_4$ and an extinction coefficient of $K_4$ satisfies $n_4\geq 1.5$ and $K_4\leq 0.45$ at the exposure light wavelength $\lambda$ falling between 140 nm and 200 nm.

12. The halftone phase-shift mask blank as claimed in claim 11, which satisfies $n_4\geq 1.7$ and $K_4\leq 0.45$ at $\lambda$ of ArF excimer laser of approximately 193 nm.

13. The halftone phase-shift mask blank as claimed in claim 11, which satisfies $n_4\geq 1.5$ and $K_4\leq 0.40$ at $\lambda$ of $F_2$ excimer laser of approximately 157 nm.

14. A halftone phase-shift mask with a mask pattern comprising a light-transmissive part and a phase shifter part, which is obtained by selectively patterning the phase shifter film in the halftone phase-shift mask blank of claim 8 to make it have a desired pattern.

15. A halftone phase-shift mask blank for halftone phase-shift masks having, on a transparent substrate, a light-transmissive part that transmit an exposure light, and a phase shifter part that transmits a part of the exposure light and shifts the phase of the transmitted light to a predetermined degree; the mask blank having a phase shifter film to form the phase shifter part on the transparent substrate being characterized in that, the phase shifter film is a four-layered or more multi-layered film composed of first, second . . . and nth layers laminated in that order on the substrate, the odd-number layers are high-refraction layers of at least one selected from a group of metals and their oxides, nitrides, nitroxides and silicon compounds, having a principal function of transmittance control, and the even-number layers are low-refraction layers of a silicon oxide or nitroxide, having a principal function of phase shift control, and wherein the transparent substrate is formed of quartz.

16. The halftone phase-shift mask blank as claimed in claim 15, wherein the total thickness of all the odd-number layers of the multi-layered film to form the phase shifter film is at most 200 angstroms.

17. The halftone phase-shift mask blank as claimed in claim 15, which is processed through exposure to light of $F_2$ excimer laser of wavelength of approximately 157 nm.

18. A halftone phase-shift mask with a mask pattern comprising a light-transmissive part and a phase shifter part, which is obtained by selectively patterning the phase shifter film in the halftone phase-shift mask blank of claim 15 to make it have a desired pattern.

19. A halftone phase-shift mask blank for halftone phase-shift masks having, on a transparent substrate, a light-transmissive part that transmit an exposure light, and a phase shifter part that transmits a part of the exposure light and shifts the phase of the transmitted light to a predetermined degree; the mask blank having a phase shifter film to form the phase shifter part on the transparent substrate being characterized in that, the phase shifter film is so planned that it is a four-layered or more multi-layered film of alternately-laminated high-refraction layers having a principal function of transmittance control and low-refraction layers having a principal function of phase shift control and at least one low-refraction layer in the film has a function of antireflection at least against the exposure light, wherein said at least one low-refraction layer having the function of antireflection satisfies the equation: $0.85 \times (\lambda/4) \times (\text{odd number}) \leq nd \leq 1.15 (\lambda/4) \times (\text{odd-number})$, wherein n is the refractive index and d is the thickness, and wherein said at least one low-refraction layer having the function of antireflection is arranged as the layer adjacent and lower than an uppermost layer of the halftone phase-shift mask blank.

20. The halftone phase-shift mask blank as claimed in claim 19, wherein the multi-layered phase shifter film is composed of first, second . . . and nth layers laminated in that order on the substrate, the odd-number layers are high-refraction layers, and the even-number layers are low-refraction layers.

21. The halftone phase-shift mask blank as claimed in claim 19, wherein the material of the high-refraction layers is at least one selected chosen from a group of metals, transition metals and their oxides, nitrides, nitroxides and silicon compounds, and the material of the low-refraction layers is a member chosen from a silicon oxide and nitroxide.

22. The halftone phase-shift mask blank as claimed in claim 19, wherein the total thickness of all the high-refraction layers is at most 200 angstroms.

23. The halftone phase-shift mask blank as claimed in claim 19, wherein the exposure light being $F_2$ excimer laser of wavelength of approximately 157 mm.

24. A halftone phase-shift mask with a mask pattern comprising a light-transmissive part and a phase shifter part, which is obtained by selectively patterning the phase shifter film in the halftone phase-shift mask blank of claim 19 to make it have a desired pattern.

25. The halftone phase-shift mask as claimed in claim 24, which is used for the exposure light in a wavelength range of approximately 157 nm of $F_2$ excimer laser.

\* \* \* \* \*